United States Patent
Lin et al.

(10) Patent No.: US 10,879,108 B2
(45) Date of Patent: Dec. 29, 2020

(54) TOPOGRAPHIC PLANARIZATION METHOD FOR LITHOGRAPHY PROCESS

(71) Applicant: Taiwan Semiconductor Manufacturing Co., Ltd., Hsinchu (TW)

(72) Inventors: Tzu-Yang Lin, Tainan (TW); Ming-Hui Weng, New Taipei (TW); Cheng-Han Wu, Taichung (TW); Chin-Hsiang Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/352,218

(22) Filed: Nov. 15, 2016

(65) Prior Publication Data

US 2018/0138050 A1    May 17, 2018

(51) Int. Cl.
*H01L 21/027* (2006.01)
*H01L 21/3105* (2006.01)
*H01L 21/311* (2006.01)
*H01L 21/768* (2006.01)
*H01L 23/528* (2006.01)
*H01L 29/06* (2006.01)

(52) U.S. Cl.
CPC .... *H01L 21/76816* (2013.01); *H01L 21/0274* (2013.01); *H01L 21/0276* (2013.01); *H01L 21/31055* (2013.01)

(58) Field of Classification Search
CPC ......... H01L 21/31051; H01L 21/31053; H01L 21/31055; H01L 21/31056; H01L 21/0276; H01L 21/02065; H01L 21/02074; H01L 21/76816; H01L 21/31127; H01L 29/0649; H01L 23/528; H01L 21/76801
See application file for complete search history.

(56) References Cited

U.S. PATENT DOCUMENTS

| | | | | |
|---|---|---|---|---|
| 4,385,975 A | * | 5/1983 | Chu | .......... H01L 21/31055 204/192.23 |
| 4,389,281 A | * | 6/1983 | Anantha | .......... H01L 21/31055 438/736 |
| 4,389,294 A | * | 6/1983 | Anantha | .......... H01L 21/31055 204/192.37 |

(Continued)

FOREIGN PATENT DOCUMENTS

EP    0 422 748 A2 *  4/1991 ............ H01L 21/311

*Primary Examiner* — Mary A Wilczewski
(74) *Attorney, Agent, or Firm* — Birch, Stewart, Kolasch & Birch, LLP (57) ABSTRACT

Topographic planarization methods for a lithography process are provided. The method includes providing a substrate having a topography surface. A planarization stack is formed over the topography surface of the substrate. The optical material stack includes a first optical material layer and an overlying second optical material layer, and the first optical material layer has a higher etching rate than the second optical material layer with respect to an etchant. The planarization stack is etched using the etchant to entirely remove the second optical material layer and partially remove the first optical material layer, such that the remaining first optical material layer has a substantially planar surface over the topography surface of the substrate.

20 Claims, 9 Drawing Sheets

(56) References Cited

U.S. PATENT DOCUMENTS

| | | | | |
|---|---|---|---|---|
| 4,460,434 A * | 7/1984 | Johnson | H01L 21/31055 | 204/192.34 |
| 4,470,874 A * | 9/1984 | Bartush | H01L 21/31055 | 204/192.25 |
| 4,481,070 A * | 11/1984 | Thomas | H01L 21/76819 | 204/192.32 |
| 4,505,025 A * | 3/1985 | Kurosawa | H01L 21/31055 | 257/506 |
| 4,511,430 A * | 4/1985 | Chen | H01L 21/31055 | 204/192.32 |
| 4,515,652 A * | 5/1985 | Gimpelson | B23K 10/00 | 204/192.32 |
| 4,529,476 A * | 7/1985 | Kawamoto | C04B 41/009 | 204/192.37 |
| 4,541,169 A * | 9/1985 | Bartush | H01L 21/31055 | 148/DIG. 100 |
| 4,545,852 A * | 10/1985 | Barton | H01L 21/31055 | 204/192.36 |
| 4,604,162 A * | 8/1986 | Sobczak | H01L 21/31055 | 257/E21.245 |
| 4,634,496 A * | 1/1987 | Mase | H01L 21/31055 | 204/192.32 |
| 4,642,162 A * | 2/1987 | Brownell | H01L 21/76819 | 204/192.15 |
| 4,676,867 A * | 6/1987 | Elkins | H01L 21/31055 | 257/752 |
| 4,676,868 A * | 6/1987 | Riley | H01L 21/31055 | 204/192.32 |
| 4,692,204 A * | 9/1987 | Fabien | H01L 21/31116 | 257/E21.245 |
| 4,803,177 A * | 2/1989 | Rabinzohn | H01L 21/76819 | 438/623 |
| 4,836,885 A * | 6/1989 | Breiten | H01L 21/31055 | 204/192.37 |
| 4,839,311 A * | 6/1989 | Riley | B24B 37/013 | 216/38 |
| 4,952,274 A * | 8/1990 | Abraham | G03F 7/24 | 204/192.32 |
| 4,962,063 A * | 10/1990 | Maydan | H01L 21/02126 | 148/DIG. 133 |
| 5,006,485 A * | 4/1991 | Villalon | H01L 21/31055 | 148/DIG. 43 |
| 5,077,234 A * | 12/1991 | Scoopo | H01L 21/31055 | 148/DIG. 50 |
| 5,139,608 A * | 8/1992 | Grivna | H01L 21/76819 | 257/E21.58 |
| 5,212,114 A * | 5/1993 | Grewal | H01L 21/31055 | 257/E21.245 |
| 5,272,115 A * | 12/1993 | Sato | H01L 21/31055 | 257/E21.245 |
| 5,294,294 A * | 3/1994 | Namose | H01L 21/31055 | 216/38 |
| 5,498,574 A * | 3/1996 | Sasaki | H01L 21/31051 | 257/E21.243 |
| 5,552,346 A | 9/1996 | Huang et al. | | |
| 5,721,172 A * | 2/1998 | Jang | H01L 21/31053 | 216/38 |
| 6,027,950 A * | 2/2000 | Harvey | H01L 21/31116 | 257/E21.245 |
| 6,170,206 B1 * | 1/2001 | Coolman | E04B 7/028 | 52/200 |
| 6,221,560 B1 * | 4/2001 | Soo | H01L 21/31053 | 148/DIG. 50 |
| 6,265,315 B1 * | 7/2001 | Lee | H01L 21/31055 | 257/E21.245 |
| 6,448,150 B1 * | 9/2002 | Tsai | H01L 21/76229 | 257/E21.244 |
| 6,593,241 B1 * | 7/2003 | Abraham | H01L 21/31055 | 438/697 |
| 6,645,869 B1 | 11/2003 | Chu et al. | | |
| 6,648,150 B2 * | 11/2003 | Hartstone | G11B 33/0461 | 211/11 |
| 7,300,595 B2 * | 11/2007 | Suwa | G11B 5/855 | 216/22 |
| 7,393,789 B2 * | 7/2008 | Abatchev | H01L 21/0337 | 438/692 |
| 7,563,675 B2 | 7/2009 | Liu et al. | | |
| 7,862,737 B2 * | 1/2011 | Kamijima | G03F 7/00 | 216/83 |
| 2006/0292843 A1 * | 12/2006 | Kim | H01L 21/76897 | 438/586 |

\* cited by examiner

TOPOGRAPHIC PLANARIZATION METHOD FOR LITHOGRAPHY PROCESS

BACKGROUND

The semiconductor industry has experienced rapid growth and demands for highly integrated semiconductor devices are increasing. Technological advances in IC materials and designs have produced generations of ICs where each generation has smaller and more complex circuits than the previous generation. However, these advances have increased the complexity of processing and manufacturing ICs. In the course of integrated circuit evolution, functional density (i.e., the number of interconnected devices per chip area) has generally increased while geometry/feature size (i.e., the smallest component that can be created using a fabrication process) has decreased. This scaling down process generally provides benefits by increasing production efficiency and lowering associated costs.

As feature sizes continue to shrink, it has become increasingly difficult to meet device planarization requirements in fabrication. Currently, a photography process is used to form smaller features (e.g., fins, lines, trenches, vias) on or in a device substrate. To build smaller features, an exposure light with a shorter wavelength (such as 193 nm or 157 nm) has been used in such photography processes, and thus the depth of focus (DOF) becomes more narrow. Consequently, the surface topography of the substrate and thickness uniformity of the layer(s) to be patterned that are formed on a topographic substrate become critical for subsequent fabrication of features with the desired sizes. For example, the topographic surface of the substrate may not be able to be patterned because of the limited DOF of the photolithography process and the loss of critical dimension (CD) control during the photolithography process.

Although various existing planarization processes for a topographic substrate have been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A to 1E are cross-sectional views of various stages of a method of forming an IC structure, in accordance with some embodiments. Additional operations can be provided before, during, and/or after the stages described in FIGS. 1A to 1E. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1A:
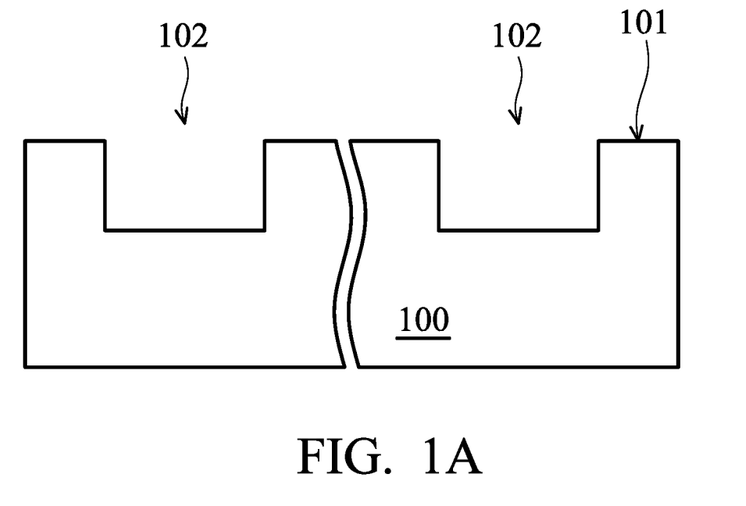
FIGS. 1A to 1E are cross-sectional views of various stages of a method of forming an integrated circuit (IC) structure, in accordance with some embodiments.

As shown in FIG. 1A, a substrate 100 is provided, in accordance with some embodiments. In some embodiments, the substrate 100 may be a semiconductor substrate. The substrate 100 is made of a semiconductor material, such as silicon, silicon germanium, or the like. In some embodiments, the substrate 100 is made of an elementary semiconductor material including silicon or germanium in a single crystal, polycrystal, or amorphous structure. In some other embodiments, the substrate 100 is made of a compound semiconductor, such as silicon carbide, gallium arsenide, gallium phosphide, indium phosphide, indium arsenide, an alloy semiconductor, such as SiGe, or GaAsP, or a combination thereof. The substrate 100 may also include multi-layer semiconductors, semiconductor on insulator (SOI) (such as silicon on insulator or germanium on insulator), or a combination thereof. Moreover, a variety of device elements (not shown) may be formed in the substrate 100. Such device elements may include active devices (such as transistors) and/or passive devices (such as resistors and/or capacitors).

In some embodiments, the substrate 100 has a topography surface 101. The term "topography" used herein sometimes refers to the height and/or depth of a structure. In some embodiments, the substrate 100 includes one or more features, formed therein to form the topography surface 101. For example, two wide trenches 102 are formed therein to form the topography surface 101, as shown in FIG. 1A. In these cases, each of the wide trenches 102 has a width in a range of about 100 nm to 500 nm. Moreover, the wide trenches 102 may be used for an isolation structure, such as a shallow trench isolation (STI) structure.

In some embodiments, the substrate 100 includes a semiconductor base and a metallization layer (which is sometimes referred to as an interconnect layer) (not shown) overlying the semiconductor base. In these cases, the metallization layer over the semiconductor base includes an inter-layer dielectric (ILD) layer and/or an overlying inter-metal dielectric (IMD) layer, which may be formed of a dielectric material including silicon oxide, silicon nitride, silicon oxynitride, aluminum oxide, hafnium oxide, lanthanum oxide, borosilicate glass (BSG), phosphoric silicate glass (PSG), borophosphosilicate glass (BPSG), fluorinated silicate glass (FSG), tetraethyl orthosilicate (TEOS) oxide, or a combination thereof, for example. Alternatively, the insulating layer 101 may include a low-k dielectric material or a porous dielectric material having low k value (dielectric constant). The k value of the low-k dielectric material or porous dielectric material may be lower than about 3.0, or lower than about 2.5, for example.

The ILD layer and/or the IMD layer may be formed by a spin-on process, a chemical vapor deposition (CVD) process (such as a low-pressure CVD (LPCVD) process, a plasma-enhanced CVD (PECVD) process, or a high-density plasma CVD (HDPCVD) process), or another suitable method.

In some embodiments, active and/or passive devices (not shown) are formed in the metallization layer and on the top of the semiconductor base. Similarly, wide trenches 102 are formed in the metallization layer to form the topography surface 101.

In some embodiments, the metallization layer also includes a conductive liner (not shown) formed on the topography surface 101 of the metallization layer in the substrate 100. Namely, at least a portion of the conductive liner conformally covers the sidewalls and bottoms of the wide trenches 102. In some embodiments, the conductive liner is made of metal (such as Ti, Ta, Al, Co, W, or Ru), metal alloy, metal silicide (such as TiN, TaN, AlN, or $WN_2$), metal sulfide, or a combination thereof. In these cases, the conductive liner may be formed by a physical vapor deposition (PVD) process, an atomic layer deposition (ALD) process, a CVD process, or another suitable method.

Figure 1B:
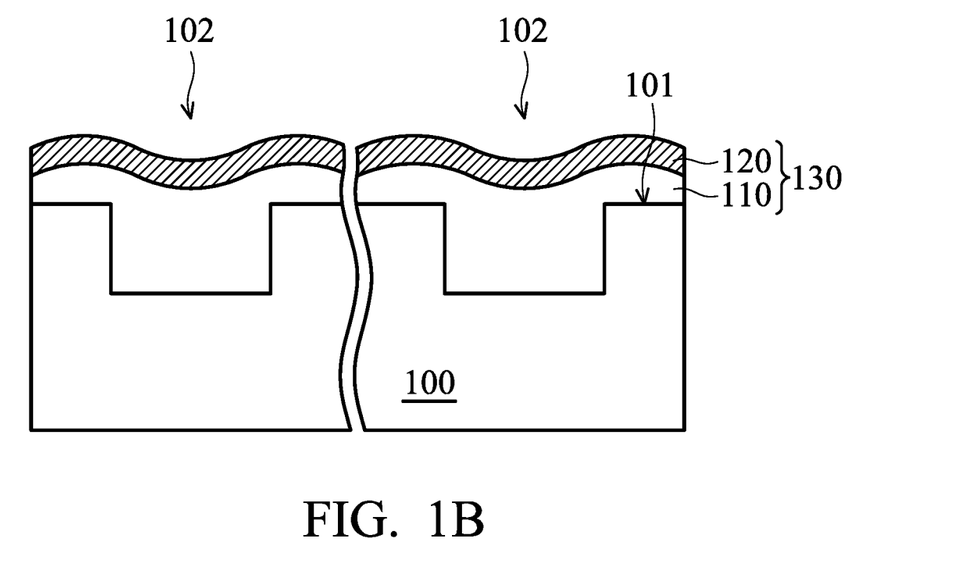

As shown in FIG. 1B, a planarization stack 130 is formed over the topography surface 101 of the substrate 100, in accordance with some embodiments. In some embodiments, the planarization stack 130 includes a first optical material layer 110 and an overlying second optical material layer 120. Due to the topography surface 101 of the substrate 100, the planarization stack 130 has a non-planar top surface, and the second optical material layer 120 has a non-uniform thickness. For example, a portion of the second optical material layer 120 above the wide trench 102 is thinner than the other portion of the second optical material layer 120 above and outside of the wide trench 102, and has a top surface of the portion of the second optical material layer 120 above the wide trench 102 lower than that of the other portion of the second optical material layer 120 above and outside of the wide trench 102.

In some embodiments, the first optical material layer 110 has a higher etching rate than the second optical material layer 120 with respect to an etchant (such as an etching gas including $O_2$, $SF_6$, $CF_4$, $C_2F_6$, $C_3F_8$, or the like, or a combination thereof). For example, the etching rate of the first optical material layer 110 may be 1.2 to 5 times higher than that of the second optical material layer 120.

In some embodiments, both the first optical material layer 110 and the second optical material layer 120 are made of a bottom anti-reflection coating (BARC) material, such as an inorganic material or an organic material (e.g., polymer, oligomer, or monomer). In these cases, the first optical material layer 110 and the second optical material layer 120 may be formed by a spin-on process, a CVD process (such as an LPCVD process, a PECVD process, or an HDPCVD process), or another suitable method. In some embodiments, the first optical material layer 110 and the second optical material layer 120 serve as a BARC layer and a sacrificial BARC layer, respectively, and are made of different polymer materials that are formed by a spin-on process. In these cases, the first optical material layer 110 and the second optical material layer 120 having different etching rates have different Onishi parameters (or Onishi numbers). The etching resistance of polymers can be compared by calculating the Onishi parameters thereof. Polymers with higher etching rates have higher Onishi parameters. In some embodiments, the first optical material layer 110 has an Onishi parameter greater than 2, and the second optical material layer 120 has an Onishi parameter less than 3. Moreover, the Onishi parameter of the first optical material layer 110 is greater than that of the second optical material layer 120, so that the first optical material layer 110 has an etching rate higher than that of the second optical material layer 120.

After the first optical material layer 110 and the second optical material layer 120 are coated over the topography surface 101 of the substrate 100, a baking process may be performed thereon. In some embodiments, the baking process is performed at a temperature in a range of about 80° C. to 400° C. In some embodiments, the baking process is performed at 150° C.

In some embodiments, both the first optical material layer 110 and the second optical material layer 120 are made of a light-sensitive material, such as a photoresist made of an organic material (e.g., polymer, oligomer, or monomer). In these cases, the first optical material layer 110 and the second optical material layer 120 may be formed by a spin-on process or another suitable method. In some embodiments, the first optical material layer 110 and the second optical material layer 120 serve as a photoresist layer and a sacrificial photoresist layer, respectively. Similarly, in these cases, the first optical material layer 110 and the second optical material layer 120 have different Onishi parameters (or Onishi numbers). For example, the first optical material layer 110 has an Onishi parameter greater than 2, and the second optical material layer 120 has an Onishi parameter less than 3. Moreover, the Onishi parameter of the first optical material layer 110 is greater than that of the second optical material layer 120, so that the first optical material layer 110 has an etching rate higher than that of the second optical material layer 120.

A baking process may be performed on the first optical material layer 110 and the second optical material layer 120 prior to the subsequent exposure process for pattern definition. In some embodiments, the baking process is performed at a temperature in a range of about 80° C. to 400° C. In some embodiments, the baking process is performed at 150° C.

Figure 1C:
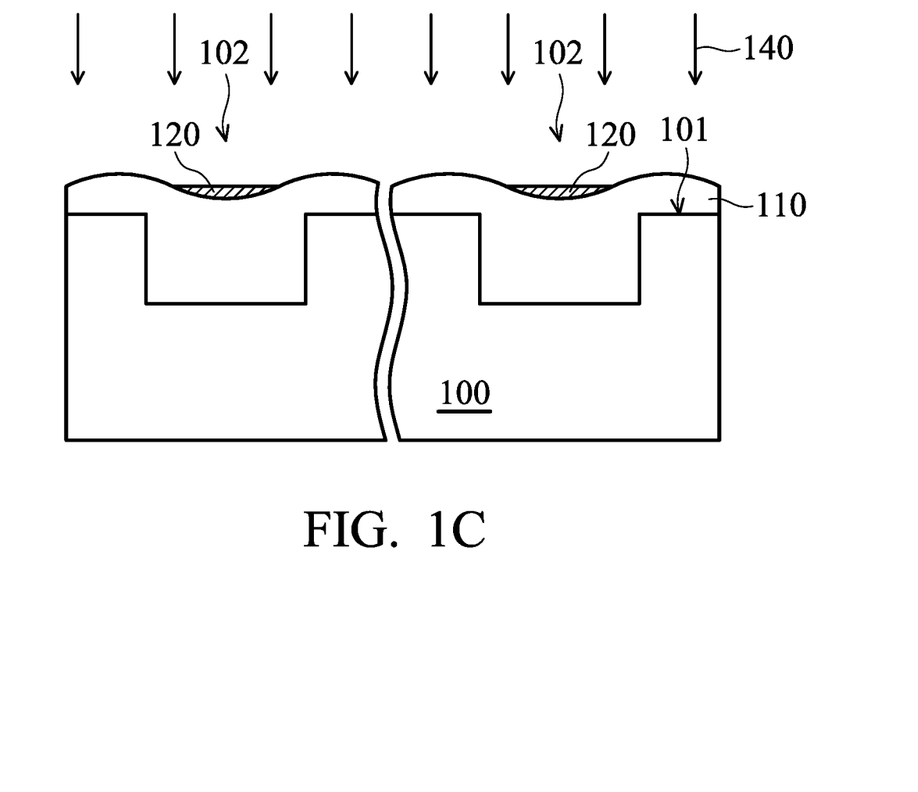

As shown in FIG. 1C, a planarization process 140 is performed on the planarization stack 130, in accordance with some embodiments. In some embodiments, the planarization stack 130 is planarized by an etching process. For example, the planarization stack 130 is planarized by a dry etching process using an etchant (e.g., an etching gas). In some embodiments, the etching gas includes $O_2$, $SF_6$, $CF_4$, $C_2F_6$, $C_3F_8$, or the like, or a combination thereof. In these cases, the dry etching process may be performed at a process temperature in a range of about −10° C. to 50° C. Moreover, the dry etching process may be performed under a process pressure in a range of about 10 mTorr to 200 mTorr.

As shown in FIG. 1C, during the planarization process 140, a portion of the second optical material layer 120 above and outside of the wide trenches 102 is removed first to expose the underlying first optical material layer 110. At this time, the exposed first optical material layer 110 has a thickness greater than that of the remaining second optical material layer 120 above the wide trenches 102. Moreover, the exposed first optical material layer 110 and the remaining second optical material layer 120 are simultaneously etched by the etchant (e.g., $O_2$, $SF_6$, $CF_4$, $C_2F_6$, $C_3F_8$, or the like, or a combination thereof) used in the planarization process 140 (e.g., the dry etching process). In some embodiments, the etching process (i.e., the planarization process 140) is stopped after the remaining second optical material layer 120 above the wide trenches 102 is entirely removed by the etchant.

Figure 1D:
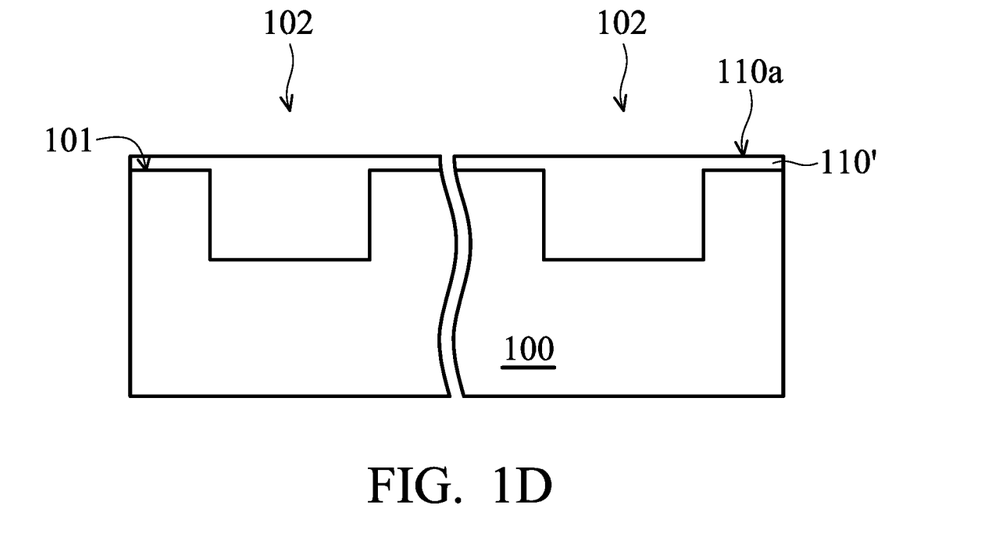

As shown in FIG. 1D, after the planarization process 140, the second optical material layer 120 is entirely removed and a portion of the first optical material layer 110 remains. As mentioned above, the etching rate of the first optical material layer 110 is higher than that of the second optical material layer 120. Moreover, the exposed first optical material layer 110 has a thickness greater than that of the remaining second optical material layer 120 above the wide trenches 102 during the planarization process 140. As a result, the remaining first optical material layer 110' has a substantially planar surface 110a over the topography surface 101 of the substrate 100 with respect to the etchant after the planarization process 140.

Figure 1E:
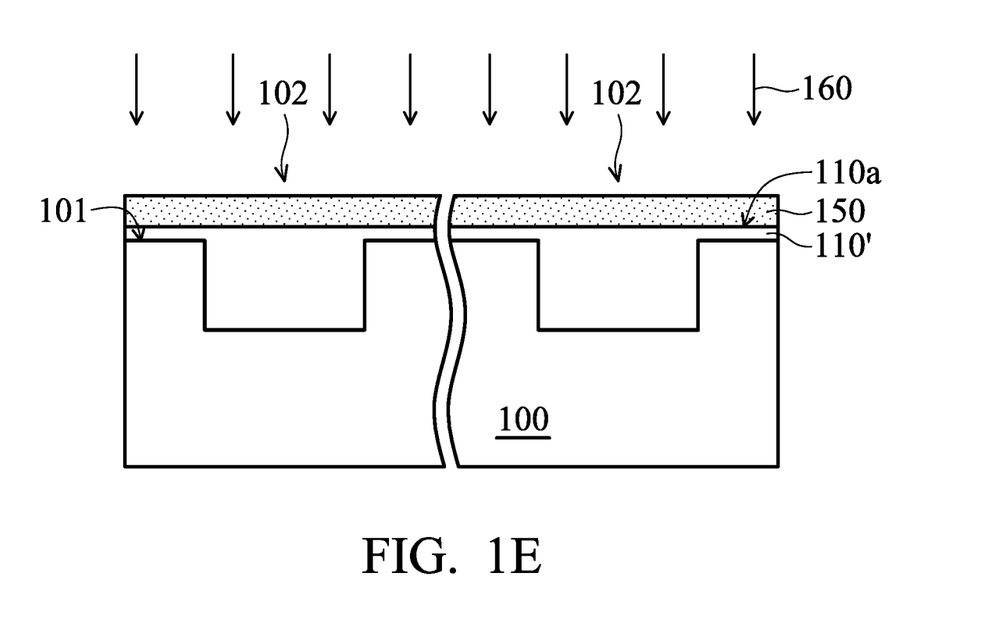

As shown in FIG. 1E, a light-sensitive layer 150 is formed over the remaining first optical material layer 110', in accordance with some embodiments. In some embodiments, the light-sensitive layer 150 (e.g., a photoresist layer) is formed over the remaining first optical material layer 110' that includes a BARC material. Afterwards, an exposure process 160 is performed on the light-sensitive layer 150 to define the desired pattern (not shown) therein. A development process may be performed on the light-sensitive layer 150 after the exposure process 160, thereby forming a masking layer with the desired pattern for transferring the desired pattern into the substrate 100.

In alternative embodiments, the exposure process 160 is performed on the remaining first optical material layer 110' that includes a light-sensitive material without forming the light-sensitive layer 150, thereby defining the desired pattern (not shown) in the remaining first optical material layer 110'. In these cases, a development process may be performed on the remaining first optical material layer 110' after the exposure process 160, thereby forming a masking layer with the desired pattern for transferring the desired pattern into the substrate 100.

FIGS. 2A to 2E are cross-sectional views of various stages of a method of forming an IC structure, in accordance with some embodiments. Elements in FIGS. 2A to 2E that are the same as or similar to those in FIGS. 1A to 1E are not described again, for brevity. Additional operations can be provided before, during, and/or after the stages described in FIGS. 2A to 2E. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
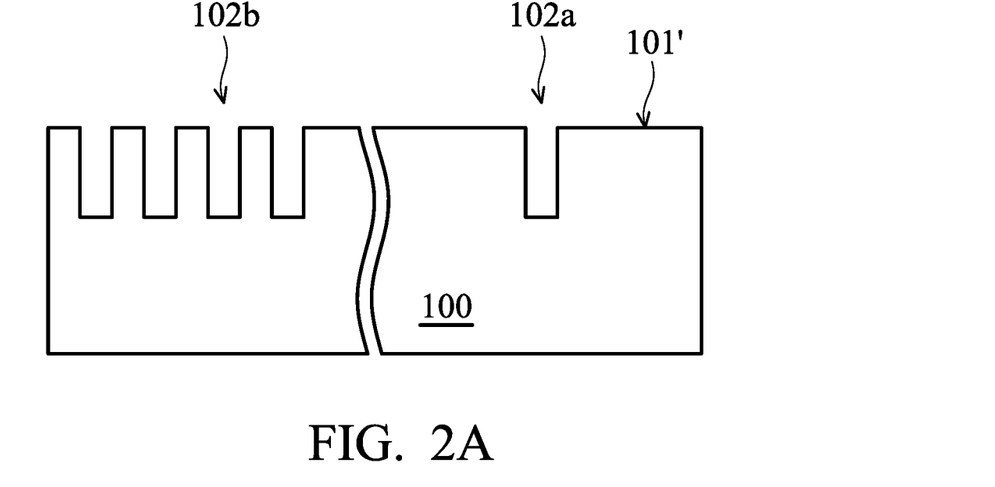
FIGS. 2A to 2E are cross-sectional views of various stages of a method of forming an IC structure, in accordance with some embodiments.

As shown in FIG. 2A, a substrate 100 is provided, in accordance with some embodiments. In some embodiments, the substrate 100 has a topography surface 101'. Moreover, the substrate 100 includes one or more features, formed therein to form the topography surface 101'. For example, the substrate 100 includes at least one isolated opening feature 102a and dense opening features 102b to form the topography surface 101'. In some embodiments, the dense opening features 102b have a pattern density in a range of about 10% to 70%. The pattern density is defined by a ratio of the critical dimension (CD) of the opening feature size to the pitch of the dense opening features 102b (i.e., the pattern density (%)=CD/pitch).

In some embodiments, the isolated opening feature 102a and the dense opening features 102b may be used for formation of contact/via holes or trenches. In these cases, a conductive liner (not shown) may be formed on the topography surface 101' of the substrate 100 to conformally cover sidewalls and bottoms of the isolated opening feature 102a and the dense opening features 102b.

Figure 2B:
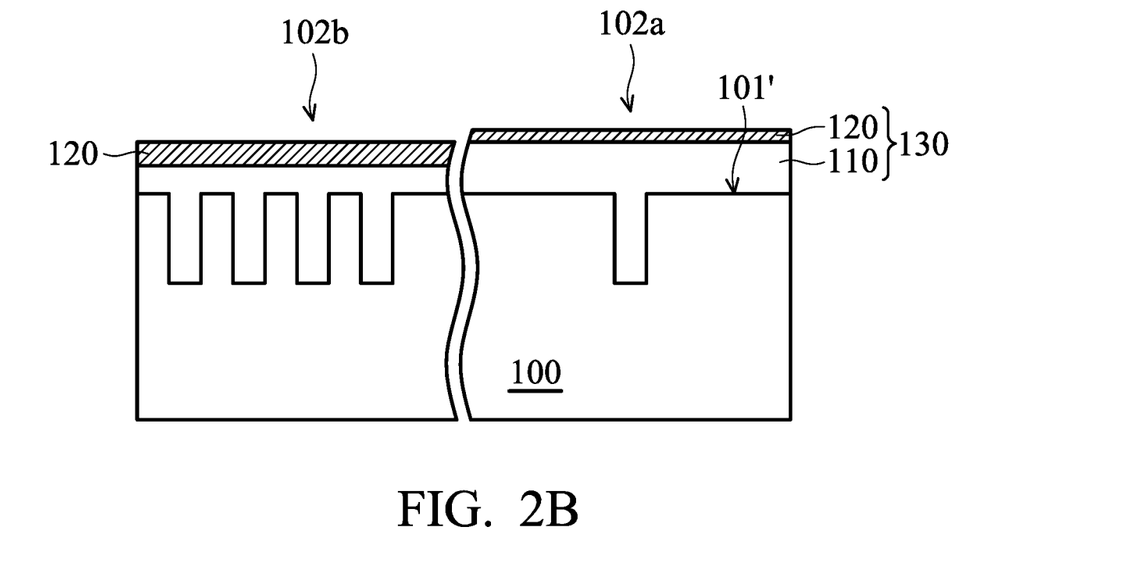

As shown in FIG. 2B, a planarization stack 130 including a first optical material layer 110 and an overlying second optical material layer 120 is formed over the topography surface 101' of the substrate 100, in accordance with some embodiments. Due to the topography surface 101' of the substrate 100, the planarization stack 130 has a non-uniform thickness and a non-planar top surface. For example, a portion of the first optical material layer 110 above dense opening features 102b (which corresponds to a dense pattern region of the substrate 100) is thinner than the other portion of the first optical material layer 110 above the isolated opening features 102a (which corresponds to an isolated pattern region of the substrate 100). Conversely, a portion of the second optical material layer 120 above the dense pattern region of the substrate 100 is thicker than the other portion of the second optical material layer 120 above the isolated pattern region of the substrate 100. However, a top surface of the planarization stack 130 corresponding to the dense pattern region of the substrate 100 is lower than that of the other portion of the planarization stack 130 corresponding to the isolated pattern region of the substrate 100.

After the first optical material layer 110 and the second optical material layer 120 are formed over the topography surface 101 of the substrate 100, a baking process may be performed thereon, in accordance with some embodiments.

Figure 2C:
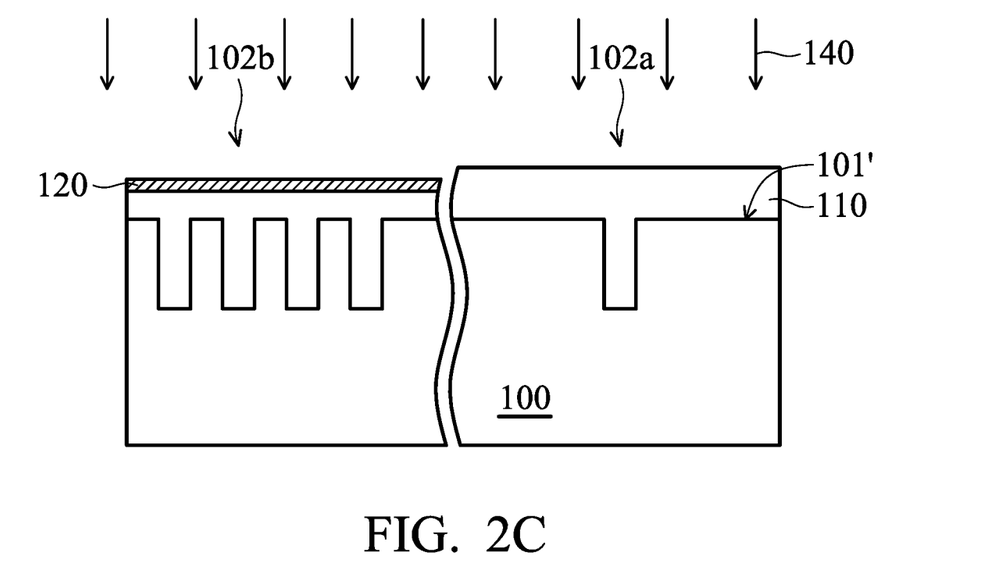

As shown in FIG. 2C, a planarization process 140 is performed on the planarization stack 130, in accordance with some embodiments. In some embodiments, the planarization stack 130 is planarized by a dry etching process using an etchant (e.g., an etching gas including $O_2$, $SF_6$, $CF_4$, $C_2F_6$, $C_3F_8$, or the like, or a combination thereof).

As shown in FIG. 2C, during the planarization process 140, a portion of the second optical material layer 120 corresponding to the isolated pattern region of the substrate 100 is removed first to expose the underlying first optical material layer 110. At this time, the exposed first optical material layer 110 has a thickness greater than that of the remaining second optical material layer 120 corresponding to the dense pattern region of the substrate 100. Moreover, the exposed first optical material layer 110 and the remaining second optical material layer 120 are simultaneously etched by the etchant used in the planarization process 140. In some embodiments, the etching process (i.e., the planarization process 140) is stopped after the remaining second optical material layer 120 corresponding to the dense pattern region of the substrate 100 is entirely removed by the etchant.

Figure 2D:
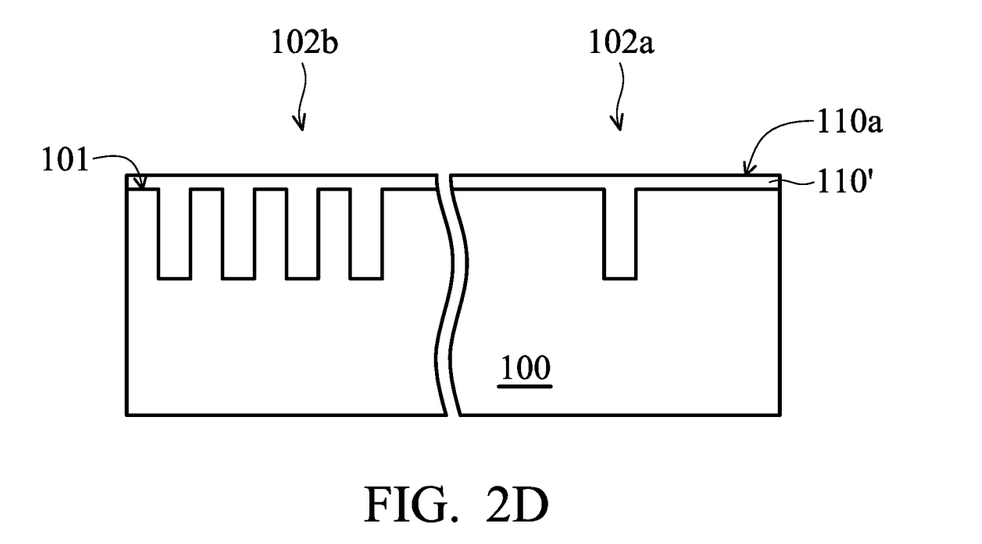

As shown in FIG. 2D, after the planarization process 140, the second optical material layer 120 is entirely removed and a portion of the first optical material layer 110 remains. Since the etching rate of the first optical material layer 110 is higher than that of the second optical material layer 120, the remaining first optical material layer 110' has a substantially planar surface 110a over the topography surface 101' of the substrate 100 with respect to the etchant after the planarization process 140.

Figure 2E:
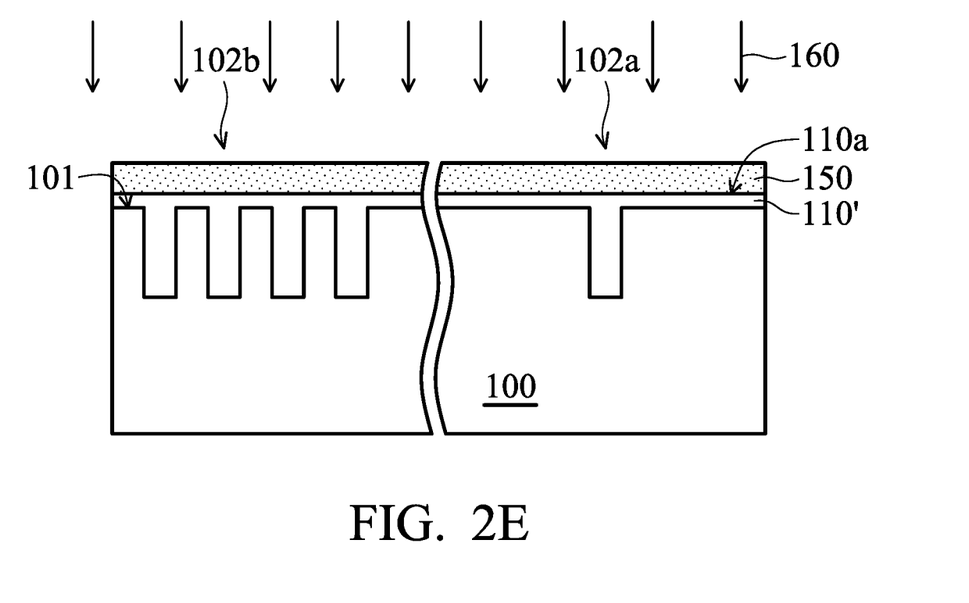

As shown in FIG. 2E, a light-sensitive layer 150 is formed over the remaining first optical material layer 110', in accordance with some embodiments. In some embodiments, the light-sensitive layer 150 is formed over the remaining first optical material layer 110' that includes a BARC material. Afterwards, an exposure process 160 is performed on the light-sensitive layer 150 to define the desired pattern (not shown) therein. A development process may be performed on the light-sensitive layer 150 after the exposure process 160, thereby forming a masking layer with the desired pattern for transferring the desired pattern into the substrate 100.

In alternative embodiments, the exposure process 160 is performed on the remaining first optical material layer 110' that includes a light-sensitive material without forming the light-sensitive layer 150, thereby defining the desired pattern (not shown) in the remaining first optical material layer 110'. In these cases, a development process may be performed on the remaining first optical material layer 110' after the exposure process 160, thereby forming a masking layer with the desired pattern for transferring the desired pattern into the substrate 100.

FIGS. 3A to 3E are cross-sectional views of various stages of a method of forming an IC structure, in accordance with some embodiments. Elements in FIGS. 3A to 3E that are the same as or similar to those in FIGS. 1A to 1E or FIGS. 2A to 2E are not described again, for brevity. Additional operations can be provided before, during, and/or after the stages described in FIGS. 3A to 3E. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 3A:
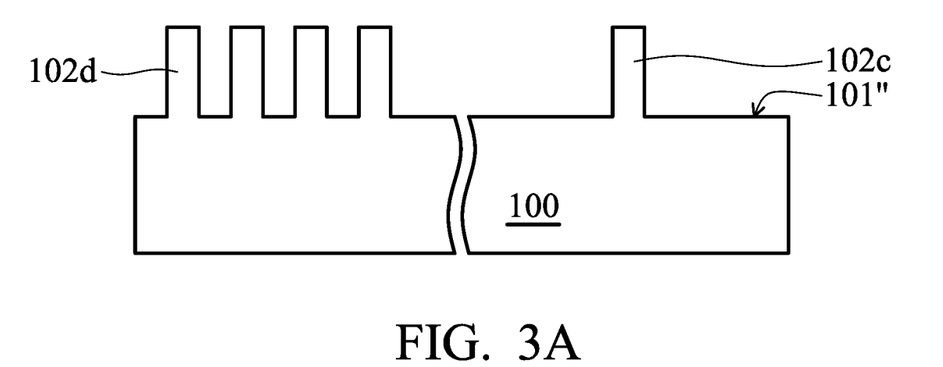
FIGS. 3A to 3E are cross-sectional views of various stages of a method of forming an IC structure, in accordance with some embodiments.

As shown in FIG. 3A, a substrate 100 is provided, in accordance with some embodiments. In some embodiments, the substrate 100 may be a semiconductor substrate that is made of a semiconductor material (such as silicon, silicon germanium, or the like), an elementary semiconductor material (which includes silicon or germanium in a single crystal, polycrystal, or amorphous structure), or a compound semiconductor (such as silicon carbide, gallium arsenide, gallium phosphide, indium phosphide, indium arsenide, an alloy semiconductor, such as SiGe, or GaAsP, or a combination thereof). The substrate 100 may also include multi-layer semiconductors, semiconductor on insulator (SOI) (such as silicon on insulator or germanium on insulator), or a combination thereof.

In some embodiments, the substrate 100 has a topography surface 101". Moreover, the substrate 100 includes one or more features, formed therein to form the topography surface 101". For example, the substrate 100 includes at least one isolated line feature (e.g., an isolated fin feature 102c for a fin field-effect transistor (FinFET)) and dense opening features 102b (e.g., dense fin features 102d for a FinFET) to form the topography surface 101". In some embodiments, the dense fin features 102d have a pattern density in a range of about 10% to 70%.

Figure 3B:
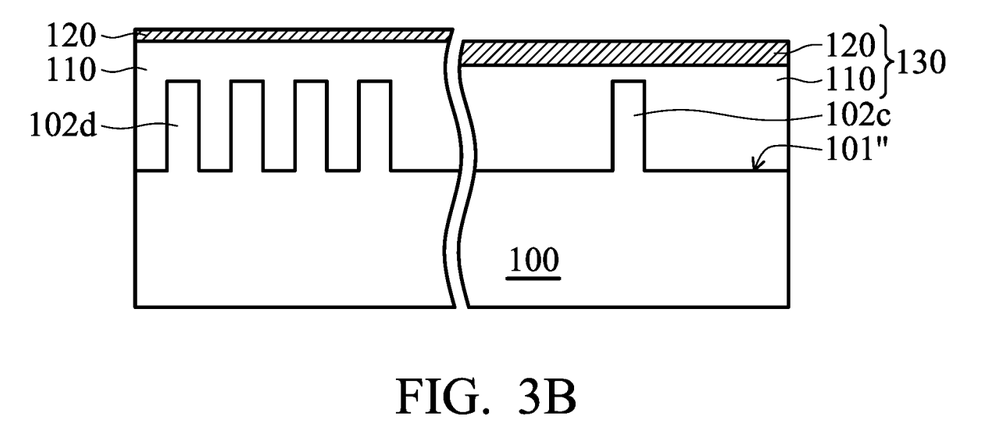

As shown in FIG. 3B, a planarization stack 130 including a first optical material layer 110 and an overlying second optical material layer 120 is formed over the topography surface 101" of the substrate 100, in accordance with some embodiments. Due to the topography surface 101" of the substrate 100, the planarization stack 130 has a non-uniform thickness and a non-planar top surface. For example, a portion of the first optical material layer 110 above dense fin features 102d (which corresponds to a dense pattern region of the substrate 100) is thicker than the other portion of the first optical material layer 110 above the isolated fin features 102c (which corresponds to an isolated pattern region of the substrate 100). Conversely, a portion of the second optical material layer 120 above the dense pattern region of the substrate 100 is thinner than the other portion of the second optical material layer 120 above the isolated pattern region of the substrate 100. However, a top surface of the planarization stack 130 corresponding to the dense pattern region of the substrate 100 is higher than that of the other portion of the planarization stack 130 corresponding to the isolated pattern region of the substrate 100. After the first optical material layer 110 and the second optical material layer 120 are formed over the topography surface 101 of the substrate 100, a baking process may be performed thereon, in accordance with some embodiments.

Figure 3C:
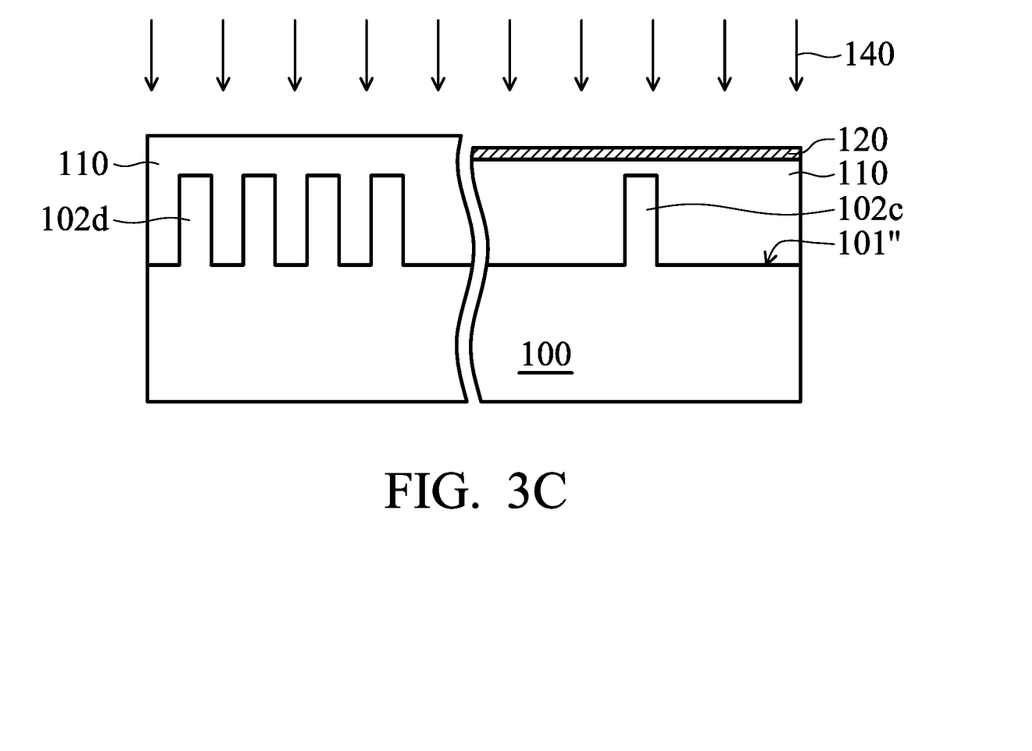

As shown in FIG. 3C, a planarization process 140 is performed on the planarization stack 130, in accordance with some embodiments. In some embodiments, during the planarization process 140, a portion of the second optical material layer 120 corresponding to the dense pattern region of the substrate 100 is removed first to expose the underlying first optical material layer 110. At this time, the exposed first optical material layer 110 has a thickness greater than that of the remaining second optical material layer 120 corresponding to the isolated pattern region of the substrate 100. Moreover, the exposed first optical material layer 110 and the remaining second optical material layer 120 are simultaneously etched by the etchant used in the planarization process 140. In some embodiments, the etching process (i.e., the planarization process 140) is stopped after the remaining second optical material layer 120 corresponding to the isolated pattern region of the substrate 100 is entirely removed by the etchant.

Figure 3D:
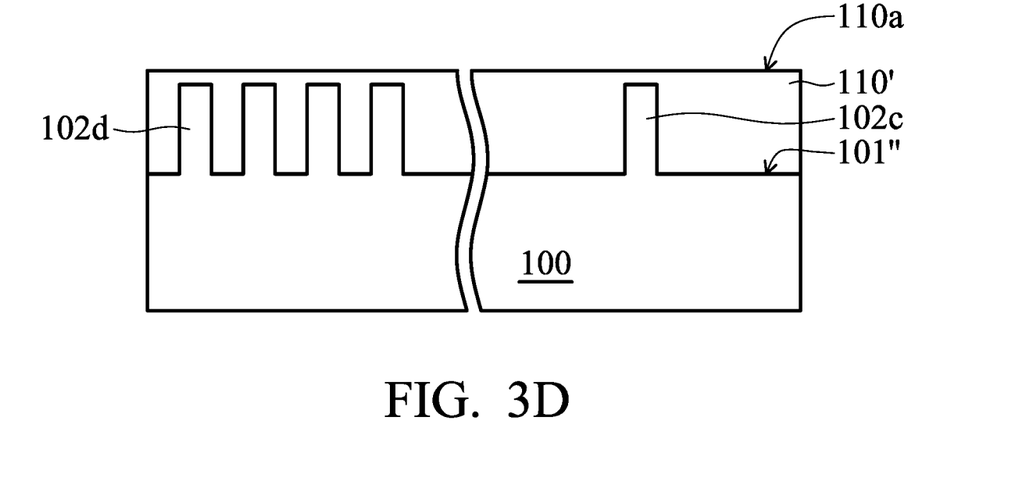

As shown in FIG. 3D, after the planarization process 140, the second optical material layer 120 is entirely removed and a portion of the first optical material layer 110 remains. Since the etching rate of the first optical material layer 110 is higher than that of the second optical material layer 120, the remaining first optical material layer 110' has a substantially planar surface 110a over the topography surface 101" of the substrate 100 with respect to the etchant after the planarization process 140.

Figure 3E:
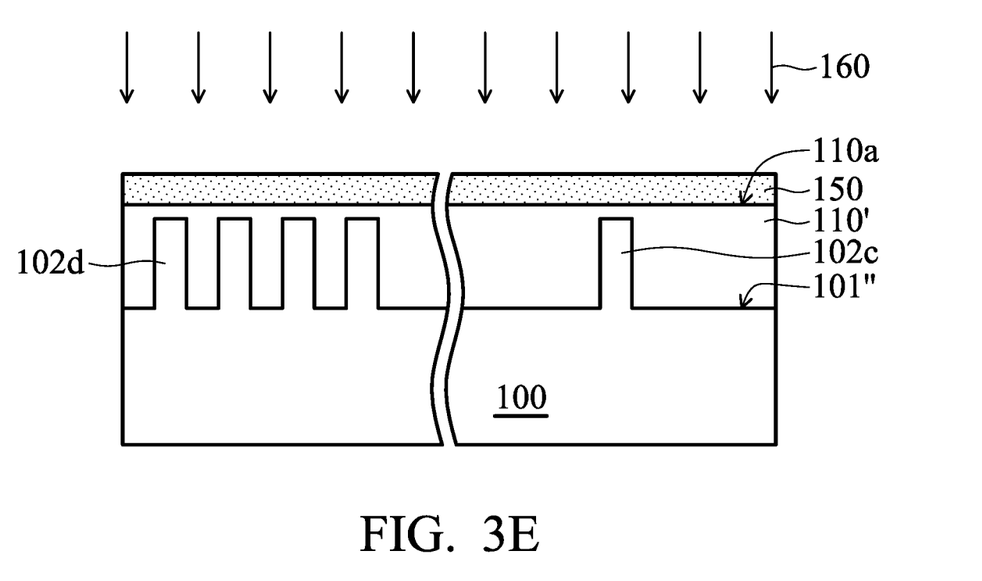

As shown in FIG. 3E, there is a light-sensitive layer 150 over the remaining first optical material layer 110', in accordance with some embodiments. In some embodiments, the light-sensitive layer 150 is formed over the remaining first optical material layer 110' that includes a BARC material. Afterwards, an exposure process 160 is performed on the light-sensitive layer 150 to define the desired pattern (not shown) therein. A development process may be performed on the light-sensitive layer 150 after the exposure process 160, thereby forming a masking layer with the desired pattern for transferring the desired pattern into the substrate 100.

In alternative embodiments, the exposure process 160 is performed on the remaining first optical material layer 110' that includes a light-sensitive material without forming the light-sensitive layer 150, thereby defining the desired pattern (not shown) in the remaining first optical material layer 110'. In these cases, a development process may be performed on the remaining first optical material layer 110' after the exposure process 160, thereby forming a masking layer with the desired pattern for transferring the desired pattern into the substrate 100.

Embodiments of the disclosure provide formation methods of an integrated circuit structure. According to foregoing embodiments of the disclosure, two optical material layers with different etching rates are provided on the topographic surface of the substrate, so as to form a substantially planar surface over the topographic surface of the substrate after performing an etching back process. As a result, the topographic surface of the substrate can be patterned because it is not beyond the limits of what the DOF of the photolithography process will allow. Therefore, the CD uniformity control during the photolithography process can be improved. Moreover, the reliability and performance of the integrated circuit structure can be improved significantly.

Additionally, the two optical material layers are planarized via a dry etching process instead of an expensive chemical mechanical polishing (CMP) process. Therefore, the manufacturing cost can be significantly reduced.

In accordance with some embodiments, a method of forming an integrated circuit structure is provided. The method includes providing a substrate having a topography surface. The method also includes forming a planarization stack over the topography surface of the substrate. The optical material stack comprises a first optical material layer and an overlying second optical material layer. Moreover, the first optical material layer has a higher etching rate than the second optical material layer with respect to an etchant. The method also includes etching the planarization stack using the etchant, to remove the entire second optical material layer and a portion of the first optical material layer, such that the remaining first optical material layer has a substantially planar surface over the topography surface of the substrate.

In accordance with some embodiments, a method of forming an integrated circuit structure is provided. The method includes providing a substrate having a surface comprising at least one isolated via hole or trench and a plurality of dense via holes or trenches formed in the surface. The method also includes forming a planarization stack over the surface of the substrate. The optical material stack includes a first optical material layer and an overlying second optical material layer. Moreover, the first optical material layer has a higher etching rate than the second optical material layer with respect to an etchant. The method also includes etching the planarization stack using the etchant, to remove entire the second optical material layer and a portion of the first optical material layer, such that the remaining first optical material layer has a substantially planar surface over the surface of the substrate.

In accordance with some embodiments, a method of forming an integrated circuit structure includes providing a semiconductor substrate having a surface comprising at least one isolated fin pattern and a plurality of dense fin patterns formed in the surface. The method includes forming a planarization stack over the surface of the substrate. The optical material stack includes a first optical material layer and an overlying second optical material layer. Moreover, the first optical material layer has a higher etching rate than the second optical material layer with respect to an etchant. The method also includes etching the planarization stack using the etchant, to remove the entire second optical material layer and a portion of the first optical material layer, such that the remaining first optical material layer has a substantially planar surface over the surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit structure, comprising:
    providing a semiconductor substrate having a topography surface comprising a metallization layer overlying semiconductor substrate, the topography surface defining a recessed region and a protruding region, wherein the protruding region has a topmost surface;
    forming a planarization stack over the topography surface of the substrate and in direct contact with the topmost surface of the protruding region, wherein the planarization stack comprises a first optical material layer and an overlying second optical material layer, and wherein the first optical material layer has a higher etching rate than the second optical material layer with respect to an etchant; and
    etching the second optical material layer by the etchant using an etching recipe, to expose a portion of the first optical material layer, and continuously etching the second optical material layer and the exposed portion of the first optical material layer by the etchant using the etching recipe until the entire second optical material layer is removed, such that the remaining first optical material layer has a substantially planar surface above the topography surface of the substrate and covers the topography surface of the substrate.

2. The method as claimed in claim 1, wherein the substrate comprises a wide trench to form the topography surface, and wherein the wide trench has a width in a range of about 100 nm to 500 nm.

3. The method as claimed in claim 1, wherein the substrate comprises at least one isolated opening feature and a plurality of dense opening features to form the topography surface, and wherein the plurality of dense opening features has a pattern density in a range of about 10% to 70%.

4. The method as claimed in claim 1, wherein the substrate comprises at least one isolated line feature and a plurality of dense line features to form the topography surface, and wherein the plurality of dense line features has a pattern density in a range of about 10% to 70%.

5. The method as claimed in claim 1, wherein the etching rate of the first optical material layer is 1.2 to 5 times higher than that of the second optical material layer.

6. The method as claimed in claim 1, wherein both the first optical material layer and the second optical material layer comprise a bottom anti-reflection coating (BARC) material.

7. The method as claimed in claim 1, wherein both the first optical material layer and the second optical material layer comprise a light-sensitive material.

8. The method as claimed in claim 7, further comprising performing an exposure process on the remaining first optical material layer to define a pattern therein.

9. A method of forming an integrated circuit structure, comprising:
providing a substrate having a surface comprising a first region having at least one isolated via hole or trench and a second region having a plurality of dense via holes or trenches formed in the surface, so that the surface defines a recessed region and a protruding region, wherein the protruding region has a topmost surface;
forming a planarization stack over the surface of the substrate and in direct contact with the topmost surface of the protruding region, wherein the planarization stack comprises a first optical material layer and an overlying second optical material layer, and wherein the first optical material layer has a higher etching rate than the second optical material layer with respect to an etchant; and
etching the second optical material layer by the etchant using an etching recipe, to expose a portion of the first optical material layer only in the first region, then continuously etching the second optical material layer in the second region to expose a portion of the first optical material layer in the second region by the etchant using the etching recipe until the entire second optical material layer is removed, such that the remaining first optical material layer covers the surface of the substrate outside of the at least one isolated via hole or trench and the plurality of dense via holes or trenches and has a substantially planar top surface.

10. The method as claimed in claim 9, wherein the etching rate of the first optical material layer is 1.2 to 5 times higher than that of the second optical material layer.

11. The method as claimed in claim 9, wherein both the first optical material layer and the second optical material layer comprise a bottom anti-reflection coating (BARC) material.

12. The method as claimed in claim 11, further comprising:
forming a light-sensitive layer over the remaining first optical material layer; and
performing an exposure process on the light-sensitive layer to define a pattern therein.

13. The method as claimed in claim 9, wherein both the first optical material layer and the second optical material layer comprise a light-sensitive material.

14. The method as claimed in claim 13, further comprising:
performing an exposure process on the remaining first optical material layer to define a pattern therein.

15. A method of forming an integrated circuit structure, comprising:
providing a substrate having a topography surface comprising a first region having at least one isolated fin pattern and a second region having a plurality of dense fin patterns formed in the topography surface, so that the topography surface defines a recessed region and a protruding region, wherein and the protruding region has a topmost surface;
forming a planarization stack over the topography surface of the substrate and in direct contact with the topmost surface of the protruding region, wherein the planarization stack comprises a first optical material layer and an overlying second optical material layer, and wherein the first optical material layer has a higher etching rate than the second optical material layer with respect to an etchant; and
etching the second optical material layer by the etchant using an etching recipe, to expose a portion of the first optical material layer only in the second region, then continuously etching the second optical material layer in the first region to expose a portion of the first optical material layer in the first region by the etchant using the etching recipe until the entire second optical material layer is removed, such that the remaining first optical material layer has a substantially planar surface above the topography surface of the substrate and covers the topography surface of the substrate.

16. The method as claimed in claim 15, wherein the etching rate of the first optical material layer is 1.2 to 5 times higher than that of the second optical material layer.

17. The method as claimed in claim 15, wherein both the first optical material layer and the second optical material layer comprise a bottom anti-reflection coating (BARC) material.

18. The method as claimed in claim 17, further comprising:
forming a light-sensitive layer over the remaining first optical material layer; and
performing an exposure process on the light-sensitive layer to define a pattern therein.

19. The method as claimed in claim 15, wherein both the first optical material layer and the second optical material layer comprise a light-sensitive material.

20. The method as claimed in claim 19, further comprising:
performing an exposure process on the remaining first optical material layer to define a pattern therein.

* * * * *